United States Patent

Sakamoto et al.

Patent Number: 6,130,833
Date of Patent: Oct. 10, 2000

[54] METHOD OF OPERATING PIEZOELECTRIC TRANSFORMER AND OPERATING CIRCUIT THEREFOR

[75] Inventors: Mamoru Sakamoto; Junichi Shimamura, both of Tokyo, Japan

[73] Assignee: Taiyo Yuden Co., Ltd., Tokyo, Japan

[21] Appl. No.: 09/198,571

[22] Filed: Nov. 23, 1998

[30] Foreign Application Priority Data

Nov. 26, 1997 [JP] Japan ................................. 9-324004

[51] Int. Cl.[7] .................................................. H02M 7/537
[52] U.S. Cl. ............................................ 363/131; 310/318
[58] Field of Search ................................ 363/71, 97, 131; 310/318

[56] References Cited

U.S. PATENT DOCUMENTS

| | | | |
|---|---|---|---|
| 5,548,189 | 8/1996 | Williams | 315/224 |
| 5,739,622 | 4/1998 | Zaitsu | 310/316 |
| 5,796,213 | 8/1998 | Kawasaki | 315/209 R |
| 5,854,543 | 12/1998 | Satoh et al. | 315/307 |
| 5,859,489 | 1/1999 | Shimada | 310/318 |

OTHER PUBLICATIONS

Text C-1-2-7, Symposium of Switching Power Source (sponsored by Japan Management Association), 1997, pages 12.

Primary Examiner—Adolf Deneke Berhane
Attorney, Agent, or Firm—Lowe Hauptman Gopstein Gilman & Berner

[57] ABSTRACT

A power source 1 and an operating circuit 4 incorporating a waveform generating circuit 5 for synthesizing composite wave W obtained by synthesizing a sine wave of primary oscillations and a sine wave of secondary oscillations of a Rosen-type piezoelectric transformer and an amplifying circuit 6 raises the voltage of the composite wave so that composite wave W' (having a waveform similar to that of W) is, as input voltage $V_{in}$, supplied to the Rosen-type piezoelectric transformer PT. Thus, output voltage $V_{out}$ having greater output electric power and higher transmitting efficiencies as compared with output voltage which can be obtained from a conventional structure in which input voltage in a single oscillation mode is employed can be produced to load resistor $R_o$.

11 Claims, 8 Drawing Sheets

Waveform of single frequency

Composite wave of primary and secondary oscillations

METHOD OF OPERATING PIEZOELECTRIC TRANSFORMER AND OPERATING CIRCUIT THEREFOR

BACKGROUND OF THE INVENTION

1. Field of the Invention

The present invention relates to a method of operating a piezoelectric transformer for use in a power source apparatus, such as a DC-DC power source, an AC-DC power source and a DC-AC power source, and an operating circuit therefor.

2. Description of the Prior Art

A piezoelectric transformer is a voltage transforming device made of a piezoelectric material, such as piezoelectric ceramics, for example, barium titanate or lead zirconate titanate (PZT).

The basic structure of the piezoelectric transformer incorporates an operating portion provided with a primary electrode. The primary electrode applies an input voltage in a direction of the thickness of a piezoelectric vibrator composed of an elongated plate made of a piezoelectric material or a piezoelectric vibrator having a structure that elongated plates each of which is made of the piezoelectric material are stacked. Thus, the primary electrode generates mechanical vibrations. Moreover, the piezoelectric transformer incorporates a power generating portion provided with a secondary electrode which converts the mechanical vibrations into a voltage so that the voltage is taken.

The piezoelectric transformers having sizes smaller than conventional electromagnetic transformers have been widely used as high-voltage generating devices or voltage transforming devices which are employed in backlight power sources of liquid crystal apparatuses, air cleaners, ozone generators, copying machines and the like.

FIG. 6 is a perspective view showing a so-called Rosen-type piezoelectric transformer which is a typical piezoelectric transformer. Referring to FIG. 6, a Rosen-type piezoelectric transformer 10 incorporates a piezoelectric vibrator 7 having a structure formed by stacking elongated plate-like sheets each of which is made of a piezoelectric material; an operating portion 11 provided with primary electrodes 8a and 8b disposed opposite to each other in a direction of the thickness of the piezoelectric vibrator 7; and a power generating portion 12 provided with a secondary electrode 9 disposed on an end surface of the piezoelectric vibrator 7.

In the above-mentioned structure, the AC input voltage $V_{in}$ is applied between the primary electrodes 8a and 8b so that the operating portion 11 generates mechanical vibrations. As a result, the AC output voltage $V_{out}$ can be obtained at the secondary electrode 9 (where $R_o$ is load resistor). Note that a hollow arrow in FIG. 6 indicates a direction of polarization.

The piezoelectric transformer includes a resonance circuit which has a resistance component, a capacitance component and an induction component of an equivalent circuit. Therefore, the frequency characteristic of transmitting efficiency η (%) of the piezoelectric transformer has peaks which are manifested at primary, secondary, tertiary, . . . , resonant frequencies f1, f2, f3, . . . .

FIG. 7 is a graph showing the relationship between frequency f (kHz) and transmitting efficiency η (%) which is realized when a sine wave input voltage is applied to the Rosen-type piezoelectric transformer 10.

As shown in FIG. 7, large resonance peaks are manifested such that primary resonant oscillations (λ/2 mode) are manifested at 47 kHz, secondary resonant oscillations (λ mode) are manifested at 93 kHz and tertiary oscillations (3λ/2 mode) are manifested at 147 kHz. Thus, piezoelectric transformer 10 acts as a kind of a filter which greatly transmits electric power only at the above-mentioned resonant frequency bands.

Therefore, to obtain a large output electric power (that is, high transmitting efficiency η), it is preferable that the piezoelectric transformer 10 is operated at integral multiples of 1/2 of the wavelength λ of the fundamental resonant frequency in the mechanical vibrations of the piezoelectric transformer 10. The integral multiples of 1/2 of the wavelength λ are the primary resonant oscillations (λ/2 mode), the secondary resonant oscillations (λ mode), the tertiary resonant oscillations (3λ/2 mode), . . . . The foregoing fact has been disclosed in Text C-1-2-7 in a Symposium of Switching Power Source (sponsored by Japan Management Association), 1997.

Therefore, a single oscillation sine wave (including a waveform close to the sine wave) or a rectangular wave has usually been used by employing any one of the foregoing oscillation modes as the input AC voltage $V_{in}$ for operating the conventional piezoelectric transformer.

Since the piezoelectric transformer has a great input electrostatic capacity, an excessively large input electric current flows in a steep portion of the waveform if the piezoelectric transformer is operated with the rectangular wave. Thus, the piezoelectric transformer of FIG. 6 has high losses, causing heat to be generated excessively. As a result, the transformation efficiency deteriorates.

Therefore, a method has usually been employed which uses a power source circuit structured as shown in FIG. 8 so that a rectangular wave formed by a power source 1 and an operating circuit 2 (for example, a transistor switching output circuit) is brought closer to the sine waveform by an inductor L so as to be applied to a piezoelectric transformer PT. Another method has usually been employed which uses a power source circuit structured as shown in FIG. 9 so that an operating circuit 3 produces an output of a sine wave so that the piezoelectric transformer PT is operated.

Since the input voltage for the power source apparatus is determined with a rated specification, electric power which can be taken is determined with the characteristic and shape of the piezoelectric transformer.

Therefore, the size of the piezoelectric transformer must be enlarged when an attempt is made to obtain large amount of electric power by using the same input voltage in a case where input AC voltage composed of only a sine wave in one oscillation mode is used to operate the piezoelectric transformer.

BRIEF SUMMARY OF THE INVENTION

An object of the present invention is to provide a method of operating a piezoelectric transformer and an operating circuit from which greater output electric power (realizing a satisfactory input voltage—output electric power characteristic) can be obtained and in which higher transmitting efficiencies η (%) can be realized without changing the size of the piezoelectric transformer as compared with a structure in which sine-wave-liked input voltage approximated to a single oscillation mode is applied if the voltages are the same value.

A method of operating a piezoelectric transformer and an operating circuit according to the present invention comprise a step of: using a composite wave which is obtained by synthesizing at least two voltage waveforms in resonant frequency bands of high-order resonant oscillations including primary resonant oscillations of the piezoelectric transformer as an input voltage waveform so as to operate the piezoelectric transformer.

A method of operating a piezoelectric transformer and an operating circuit according to the present invention comprise a step of: operating the piezoelectric transformer with synthesized wave voltage obtained by synthesizing at least two input voltage waveforms of sine waves in resonant frequency bands of high-order resonant oscillations including primary resonant oscillations of the piezoelectric transformer.

A method of operating a piezoelectric transformer and an operating circuit according to the present invention comprise a step of: operating the Rosen-type piezoelectric transformer by using a composite wave obtained by synthesizing a sine-wave-liked primary oscillations ($\lambda/2$ mode) of the Rosen-type piezoelectric transformer and a sine-wave-liked secondary oscillations ($\lambda$ mode) as an input voltage waveform.

As described above, the present invention has the structure that the composite wave obtained by synthesizing at least two single mode waveforms (preferably sine waves) of resonant frequency bands of resonant frequencies f1, f2, f3, ..., of high-order oscillations (n-order oscillations) including primary oscillations of the piezoelectric transformer is, as input AC voltage $V_{in}$, used so as to operate the piezoelectric transformer. A synergistic effect of the different oscillation modes of the composite wave is used so that a higher transmitting efficiency is obtained.

DETAILED DESCRIPTION OF PREFERRED EMBODIMENTS

An embodiment of the present invention will now be described with reference to the drawings.

Figure 1:
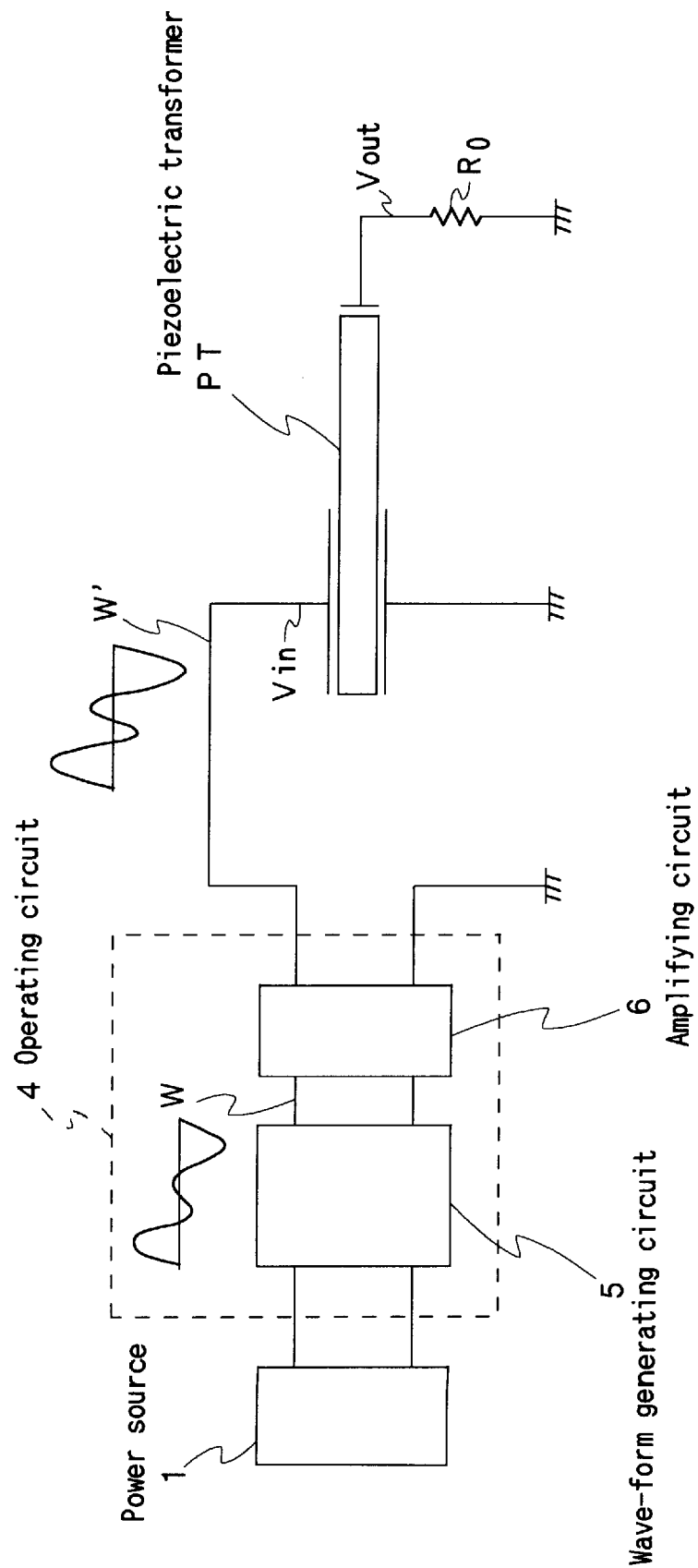
FIG. 1 is a schematic block circuit diagram of a power source apparatus incorporating a piezoelectric-transformer operating circuit according to the present invention.

FIG. 1 is a schematic block circuit diagram showing a power source apparatus using a operating circuit for a piezoelectric transformer according to the present invention. Referring to FIG. 1, symbol PT represents a piezoelectric transformer which is, for example, the Rosen-type piezoelectric transformer 10 which has been described as the conventional example. Reference numeral 1 represents a power source and 4 represents an operating circuit composed of a waveform generating circuit 5 and an amplifying circuit 6.

Figure 2:
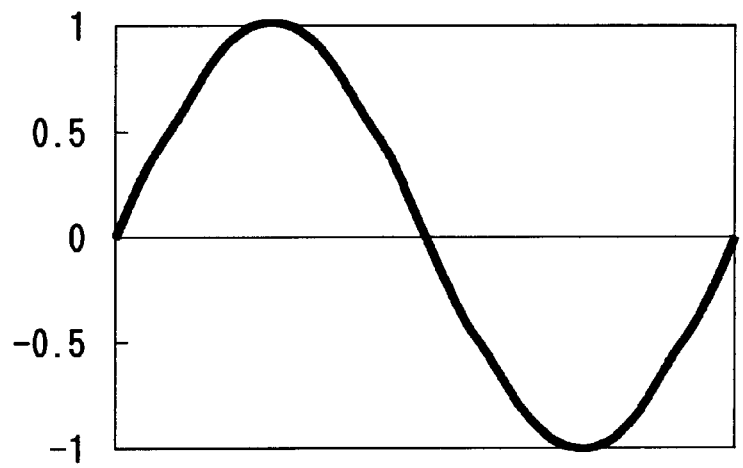
FIG. 2 is a graph showing the waveform of a single frequency and normalized sine wave.
Figure 3:
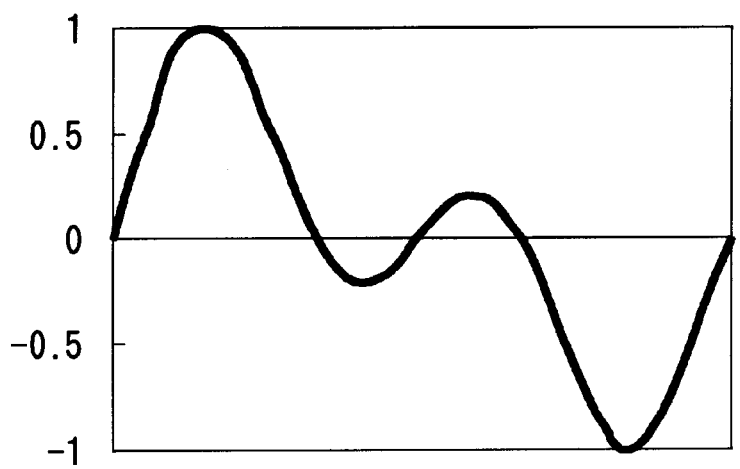
FIG. 3 is a graph showing the waveform of a composite wave obtained by synthesizing primary oscillations ($\lambda/2$ mode) and secondary oscillations ($\lambda$ mode) of the sine waveform.

The waveform generating circuit 5 is supplied with electric power from the power source 1 so that the waveform generating circuit 5 generates a primary oscillation which is sine wave or is similar to a sine wave (so called a sine-wave-liked primary oscillation) and a secondary oscillation which is a sine wave or is similar to a sine wave (so called a sine-wave-liked secondary oscillation) at an approximate frequency to resonant frequency of the piezoelectric transformer PT. For example, these waves are shaped into a single-frequency sine wave as shown in FIG. 2 respectively. Then, the waveform generating circuit 5 synthesizes the sine waves so as to produce an output of a composite wave W as shown in FIG. 3.

FIG. 2 is a graph showing the waveform of a single-frequency and normalized sine wave in a frequency and an amplitude. FIG. 3 is a graph showing the waveform of a composite wave obtained by synthesizing primary oscillations ($\lambda/2$ mode) and secondary oscillations ($\lambda$ mode) of the sine waveform.

The composite wave W transmitted from the waveform generating circuit 5 is amplified by the amplifying circuit 6 so that the composite wave W is, as composite wave W', applied to an operating portion of the piezoelectric transformer PT.

In the amplifying circuit 6, the voltage of the waveform of the composite wave W' is boosted in a state in which the form of composite wave W' maintains a similar waveform of the composite wave W realized in a state before the amplifying process is performed. Then, the boosted composite wave W' is, as input voltage $V_{in}$, applied to the Rosen-type piezoelectric transformer PT. And, an output voltage $V_{out}$ is produced from the electric power generating portion of the piezoelectric transformer PT to load resistor $R_o$.

Figure 4:
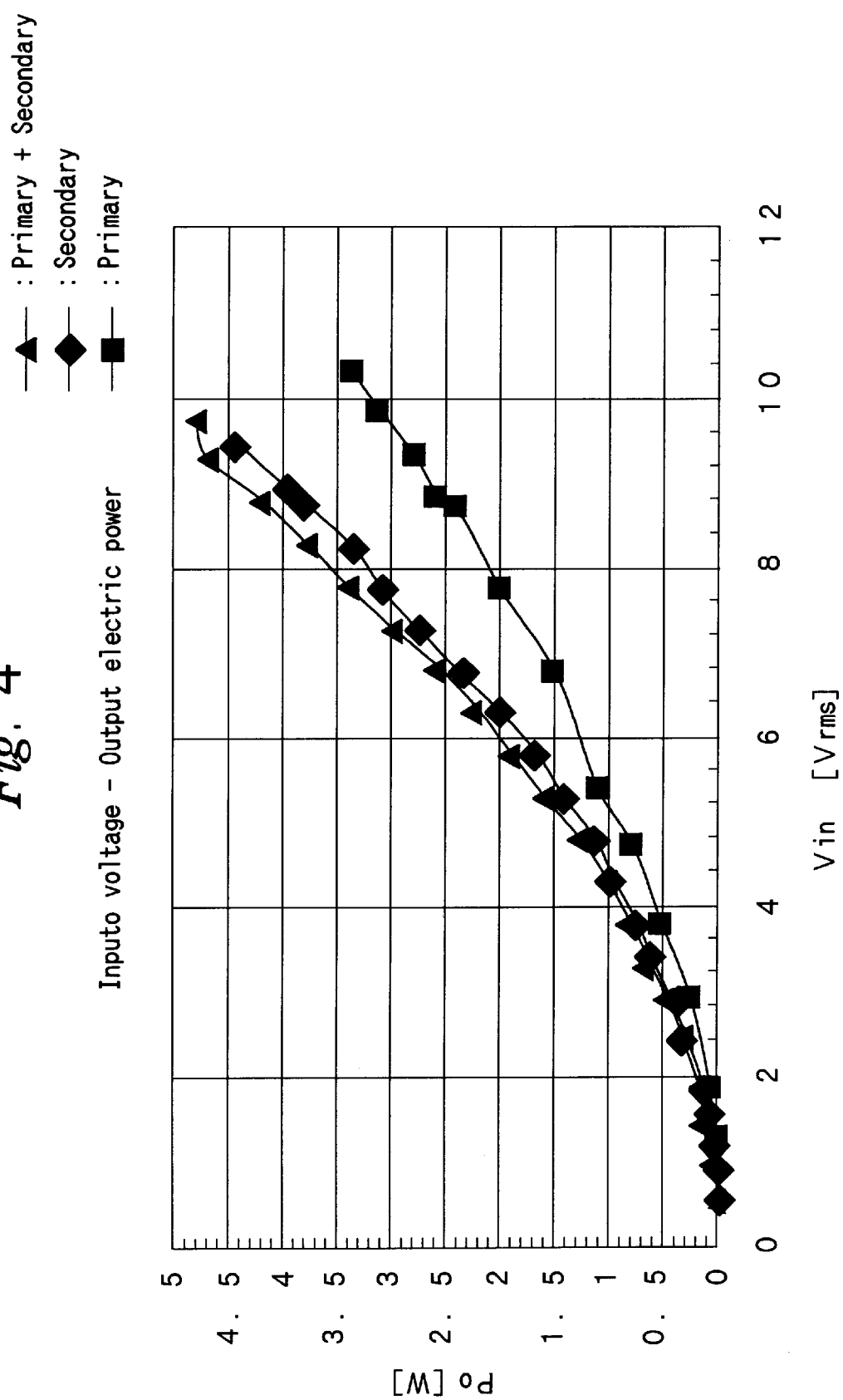
FIG. 4 is a graph showing characteristics of input voltage ($V_{in}$) and output electric power ($P_o$) realized when sine-wave-liked primary oscillations (plotted with black square marks), sine-wave-liked secondary oscillations (plotted with black rhombus marks) and a composite waveform (plotted with black triangle marks) of the primary oscillations and secondary oscillations, respectively, are supplied.
Figure 5:
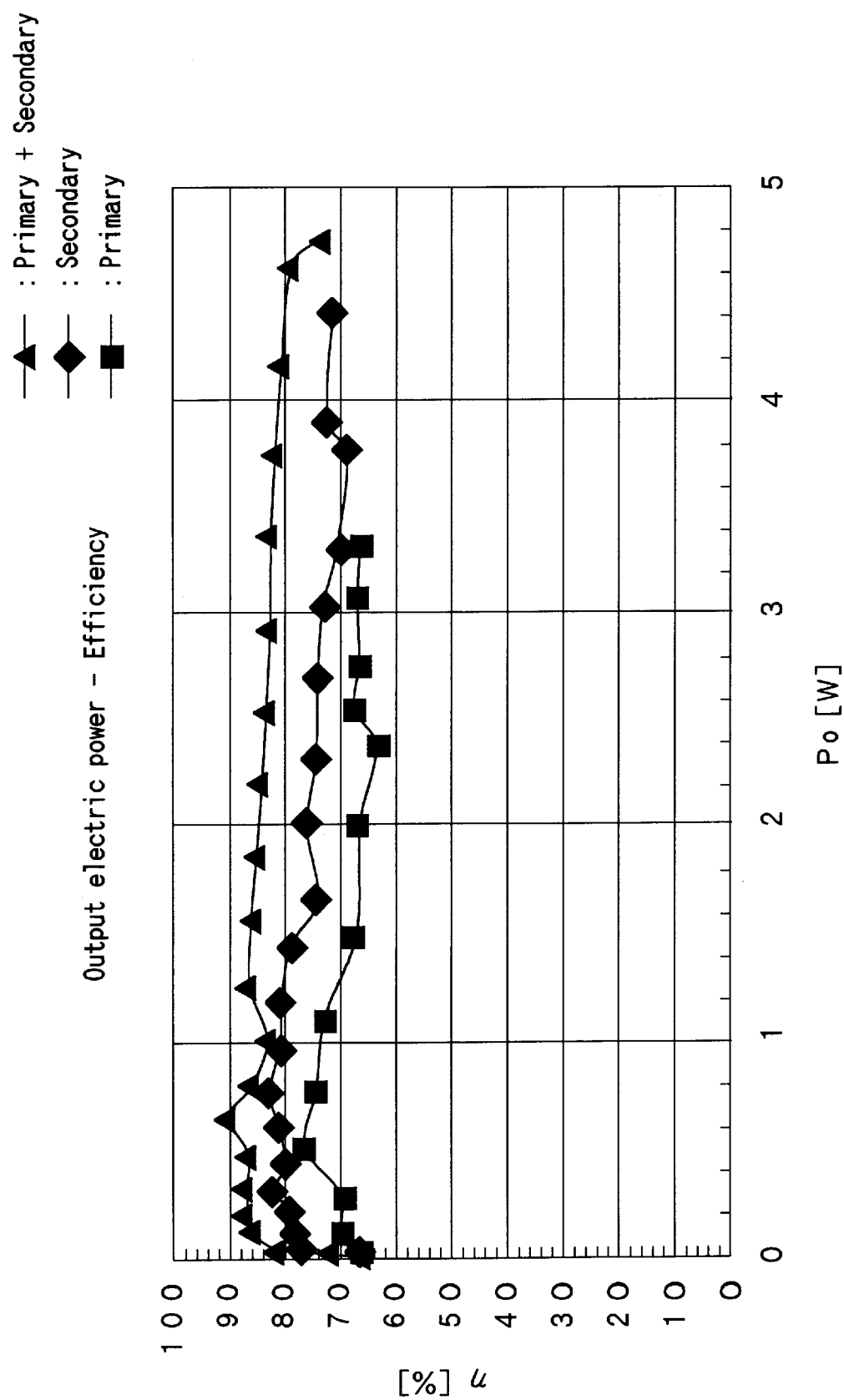
FIG. 5 is a graph showing output electric power ($P_o$) and transmitting efficiencies ($\eta$) when sine-wave-liked primary oscillations (plotted with black square marks), sine-wave-liked secondary oscillations (plotted with black rhombus marks) and a composite waveform (plotted with black triangle marks) of the primary oscillations and secondary oscillations, respectively, are supplied.
Figure 6:
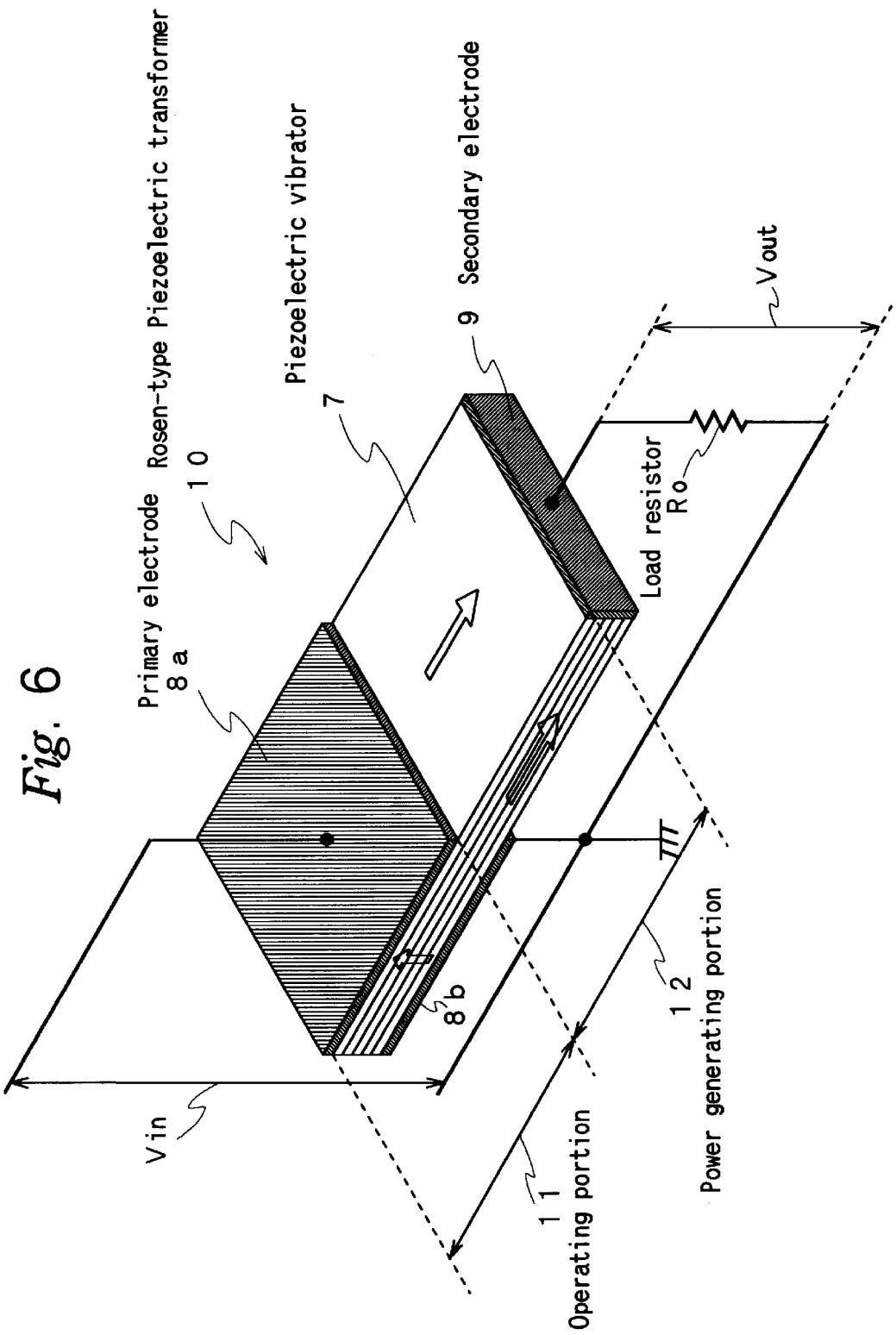
FIG. 6 is a perspective view showing a so-called Rosen-type piezoelectric transformer which is a typical piezoelectric transformer.

FIGS. 4 and 5 show results of experiments for evaluating the present invention. FIG. 4 shows characteristics of output electric power ($P_o$) realized when sine-wave-liked primary oscillations (plotted with black square marks) and sine-wave-liked secondary oscillations (plotted with black rhombus marks) and a composite waveform (plotted with black triangle marks) of the primary and secondary oscillations are used as input voltages ($V_{in}$) for the piezoelectric transformer PT respectively. The axis of ordinate of the graph shown in FIG. 4 stands for output electric power ($P_o$) and the axis of abscissa stands for input voltages ($V_{in}$).

FIG. 5 shows the relationships between output electric power ($P_o$) and transmitting efficiency ($\eta i$) when sine-wave-liked primary oscillations (plotted with black square marks) and sine-wave-liked secondary oscillations (plotted with black rhombus marks) of the same and a composite waveform (plotted with black triangle marks) of the primary and secondary oscillations are supplied to the piezoelectric transformer PT respectively. The ordinate axis of the graph shown in FIG. 5 stands for the transmitting efficiency (η) and the abscissa axis stands for the output electric power ($P_o$) in the condition of the same value in amplitude of the input voltage in every case.

FIG. 4 shows results of comparisons in terms of the input electric power $P_o$. The comparisons are made with the case "A" (plotted with black square marks) where the input voltage $V_{in}$ is the input voltage composed of only the primary oscillations and the case "B" (plotted with black rhombus marks) where the same is the input voltage composed of only the secondary oscillations and the case "C" (plotted with black triangle marks) where that is the input voltage composite waveform of the sine-wave-liked primary and secondary oscillations. As can be understood from the graph, greater output electric power can be obtained from the piezoelectric transformer PT in the case "C" than that in the case "A" or case "B". In other words, when the composite wave W' obtained by synthesizing the primary oscillations and the secondary oscillations is used as the input voltage for the piezoelectric transformer, greater output electric power can be obtained from the piezoelectric transformer PT.

As described above, FIG. 5 shows the transmitting efficiency η (%) with respect to the output electric power $P_o$ when the primary oscillations, the secondary oscillations and the composite wave of the primary and secondary oscillations are supplied to the piezoelectric transformer as the input voltage. As can be understood from FIG. 5, higher transmitting efficiencies η can be realized when the composite wave (plotted with black triangle marks) of the primary and secondary oscillations are used as the input voltage as compared with the case where the primary oscillations or the secondary oscillations is used as the input voltage every plotted points in FIG. 4.

As can be understood from the foregoing results, the piezoelectric transformer PT is operated with a composite wave (for example, a composite wave of primary, secondary and tertiary oscillations) obtained by synthesizing two or more high-order oscillation modes of the piezoelectric transformer PT as well as the foregoing composite wave W' of the primary and secondary oscillations. Thus, higher transmitting efficiencies and greater output electric power can be obtained.

Figure 7:
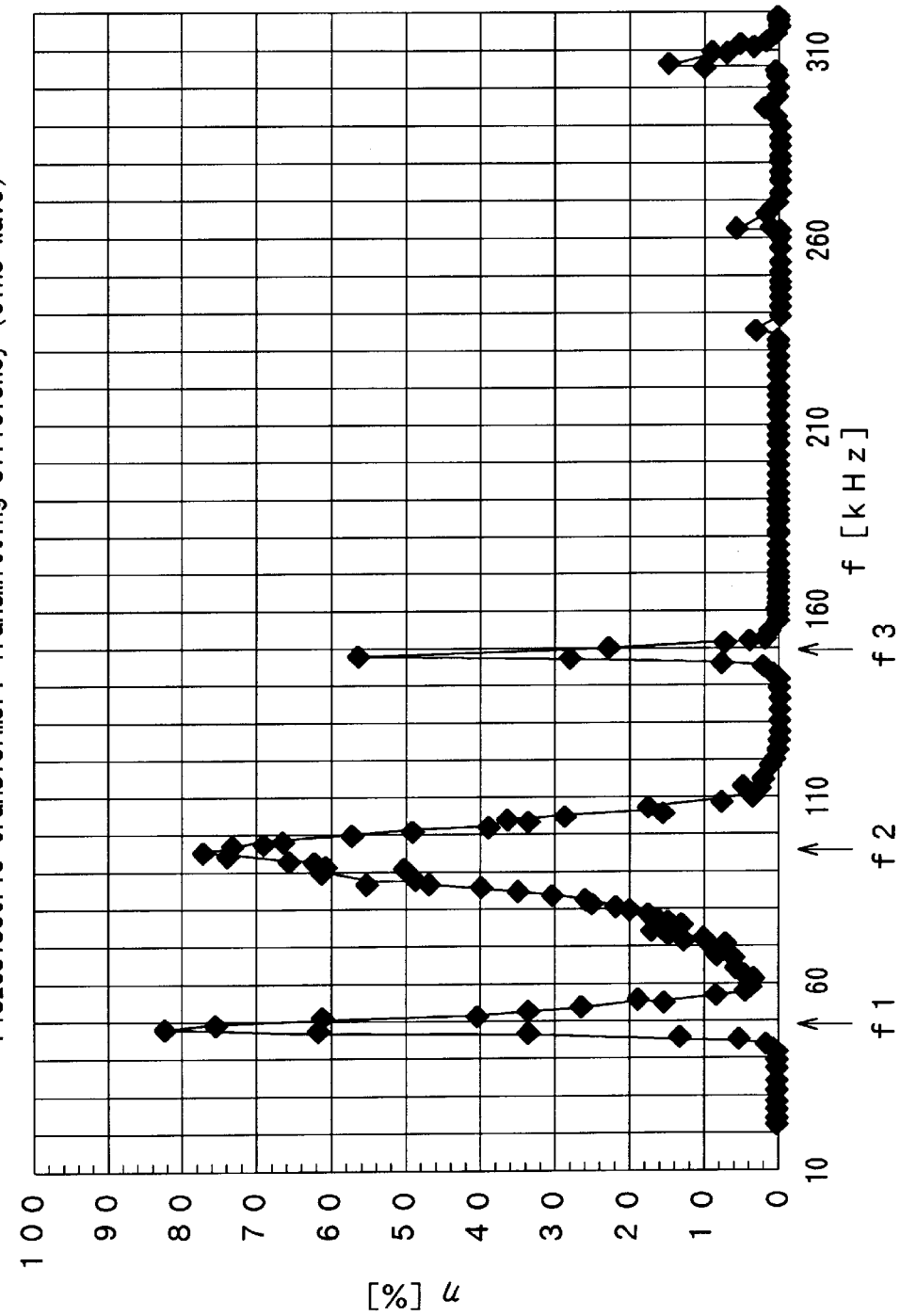
FIG. 7 is a graph showing frequencies f (kHz) and transmitting efficiencies $\eta$ realized when sine-wave-liked input voltage has been applied to the Rosen-type piezoelectric transformer.
Figure 8:
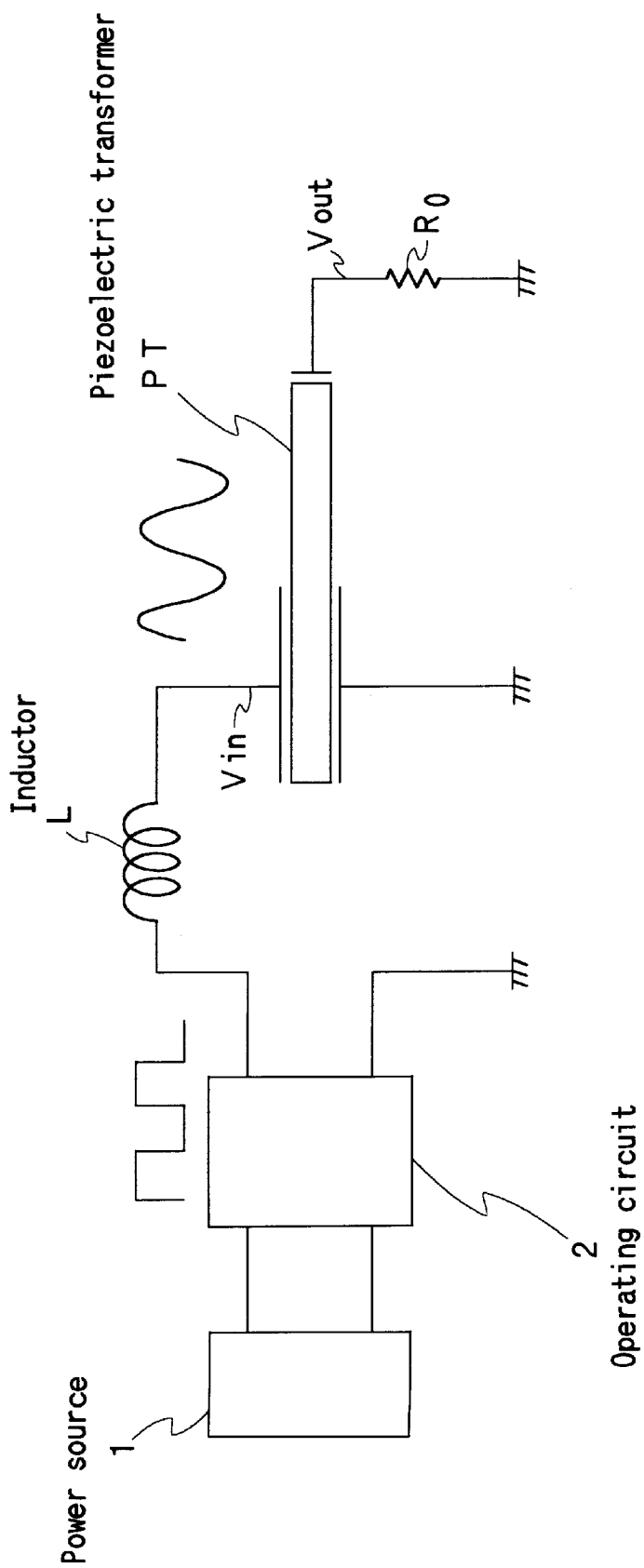
FIG. 8 is a diagram showing the structure of a power source circuit incorporating a conventional piezoelectric-transformer operating circuit.
Figure 9:
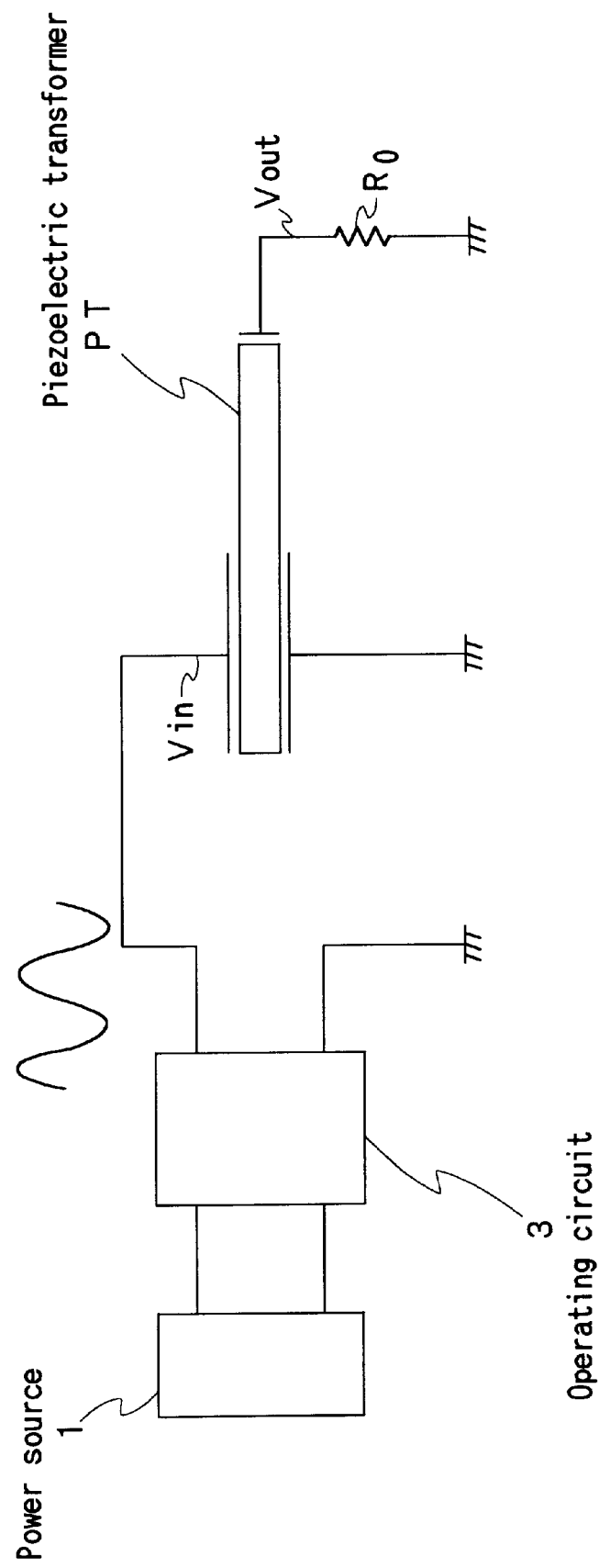
FIG. 9 is a diagram showing the structure of another power source circuit incorporating the conventional piezoelectric-transformer operating circuit.

For the resonant frequency characteristic shown in FIG. 7, the effective region of the synergistic effect of the oscillation modes is considered to be tertiary oscillations or lower-order oscillations.

Therefore, from the results shown in FIGS. 4 and 5 and 7 the waveform generating circuit 5 in the operating circuit 4 can be composed simply and satisfactorily and the Rosen-type piezoelectric transformer is operated with a significant synergistic effect when the composite wave of the primary oscillations (λ/2 mode) and the secondary oscillations (λ mode) are employed.

As described above, the method of operating the piezoelectric transformer according to the present invention enables greater output of electric power with respect to the same value in amplitude of input voltage and higher transmitting efficiencies to be obtained as compared with a piezoelectric transformer while is operated with a single oscillation mode sine wave.

Note that the amplifying circuit 6 may be omitted, as necessary. As a matter of course, the piezoelectric transformer which must be operated by the operating method and the operating circuit according to the present invention is not limited to the Rosen-type piezoelectric transformer. Any piezoelectric transformer having high-order oscillation modes.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A method of operating a piezoelectric transformer comprising: combining at least two voltage waveforms in resonant frequency bands of high-order resonant oscillations including primary resonant oscillations of said piezoelectric transformer to derive a composite wave, and applying the composite wave as an input activating voltage waveform to said piezoelectric transformer.

2. A method of operating a piezoelectric transformer comprising: combining at least two input voltage sine wave waveforms to derive a synthesized wave voltage, the sine wave waveforms being in resonant frequency bands of high-order resonant oscillations including primary resonant oscillations of said piezoelectric transformer, and driving said piezoelectric transformer with said synthesized wave voltage.

3. A method of operating a Rosen-type piezoelectric transformer having a primary λ/2 oscillating mode and a secondary λ oscillating mode comprising combining sine-wave-like primary oscillations (having the λ/2 mode) and sine-wave-like secondary oscillations (having the λ mode) to derive a composite wave, and applying the composite wave as an input voltage waveform to the Rosen-type piezoelectric transformer.

4. A circuit for operating a piezoelectric transformer including a primary electrode and a secondary electrode, the piezoelectric transformer responding to a voltage applied to the primary electrode of said piezoelectric transformer to cause an output voltage to be produced from the secondary electrode the circuit comprising a composite wave voltage source coupled to the primary electrodes, the composite wave voltage source being arranged for combining and supplying to the primary electrode at least two voltage waveforms of resonant frequency bands of higher resonant oscillations including primary resonant oscillations of said piezoelectric transformer.

5. The circuit for operating a piezoelectric transformer according to claim 4, wherein the source is arranged to produce an output having a composite wave voltage which is obtained by combining voltage waveforms of primary resonant oscillations and secondary resonant oscillations of said piezoelectric transformer.

6. The circuit for operating a piezoelectric transformer according to claim 4, wherein each voltage waveform of the high-order resonant oscillations is similar to a sine wave.

7. The circuit for operating a piezoelectric transformer according to claim 5, wherein each voltage waveform of the high-order resonant oscillations is similar to a sine wave.

8. An electric power apparatus comprising:

a piezoelectric transformer, which has at least two resonance oscillation modes of the high resonant oscillations which contains primary resonant oscillations, and which outputs electric power according to a supplied actuator voltage, and a circuit for supplying to said piezoelectric transformer an actuating voltage in the form of a composite wave, the circuit being arranged for deriving said composite wave from a combination of plural voltage waveforms in frequency bands which are approximately the same as at least two resonant oscillation modes of the piezoelectric transformer.

9. The electric power apparatus according to claim 8, wherein each of said actuating voltage waveforms forming said composite wave is a corrugation like a sine wave.

10. The electric power apparatus according to claim 8, wherein said circuit is arranged so the composite wave is formed by combining voltage waveforms which are sine-wave-like primary ($\lambda/2$ mode) and secondary ($\lambda$ mode) and tertiary ($3\lambda/2$ mode) oscillations of said piezoelectric transformer.

11. The electric power apparatus according to claim 8, wherein said composite wave is formed by synthesizing voltage waveforms which are sine-wave-liked primary ($\lambda/2$ mode) and secondary ($\lambda$ mode) and tertiary ($3\lambda/2$ mode) oscillations of said piezoelectric transformer.

* * * * *